United States Patent [19]

Masumoto et al.

[11] Patent Number: 5,351,015
[45] Date of Patent: Sep. 27, 1994

[54] TIME BASED DATA SEPARATOR ZONE CHANGE SEQUENCE

[75] Inventors: Rodney T. Masumoto, Tustin; Shunsaku Ueda, Carlsbad; Jenn-Gang Chern, Yorba Linda; Kirby Lam, Santa Margarita, all of Calif.

[73] Assignee: Silicon Systems, Inc., Tustin, Calif.

[21] Appl. No.: 12,914

[22] Filed: Feb. 3, 1993

[51] Int. Cl.$^5$ .............................................. H03L 7/00
[52] U.S. Cl. ...................................... 331/1 R; 331/25
[58] Field of Search ...................... 331/1, 1 R, 1 A, 8, 331/16, 17, 25; 307/525

[56] References Cited

U.S. PATENT DOCUMENTS

| | | | |
|---|---|---|---|
| 3,992,679 | 11/1976 | Isono | 331/1 R |
| 4,336,505 | 6/1982 | Meyer | 331/1 R |
| 4,520,327 | 5/1985 | Myers | 331/1 R |
| 5,019,785 | 5/1991 | Fognini et al. | 331/1 R |
| 5,036,216 | 7/1991 | Hohmann et al. | 331/1 R |
| 5,065,408 | 11/1991 | Gillig | 331/1 A |
| 5,216,698 | 6/1993 | Boulanger et al. | 331/1 R |
| 5,233,314 | 8/1993 | McDermott et al. | 331/1 A |
| 5,247,265 | 9/1993 | Norimatsu | 331/25 |

*Primary Examiner*—Raymond A. Nelli
*Attorney, Agent, or Firm*—Hecker & Harriman

[57] ABSTRACT

The present invention provides a method and an apparatus for controlling initial transients in a frequency synthesizer by controlling the start-up sequence of the device. The start-up sequence comprises several steps. The voltage controlled oscillator(s) (VCO) is reset so that the VCO(s) are in a known state during start-up. The charge pump and phase detector of phase-locked loop (PLL) are disabled. New data values are loaded into counter(s)/register(s) that control the frequency of the VCO(s). Also, a data value is provided to a digital-to-analog converter (DAC) to set the data rate for the PLL. A fixed amount of time is provided as a delay for the DAC to settle (i.e., 1.6 μs). Divide-by-M and divide-by-N counters are then enabled. Also, the phase detector of the phase-locked loop (PLL) is enabled. The VCO is then restarted. By utilizing a start-up sequence, the center frequency of the VCO is already settled when changing frequencies, the divide-by-M and divide-by-N counters are matched, the VCO starts in phase with the reference frequency of the reference signal, and the voltage of the loop filter is prevented from railing. By using dual buffered registers for each counter, loading of the divide-by-M and divide-by-N counters is accomplished without shutting down the VCO. A timer provides a 1.6 μs delay to allow the DAC to settle. Digital logic is used to synchronize signals. Delay compensation circuitry is used to implement delay cancellation for zero phase restart.

21 Claims, 6 Drawing Sheets

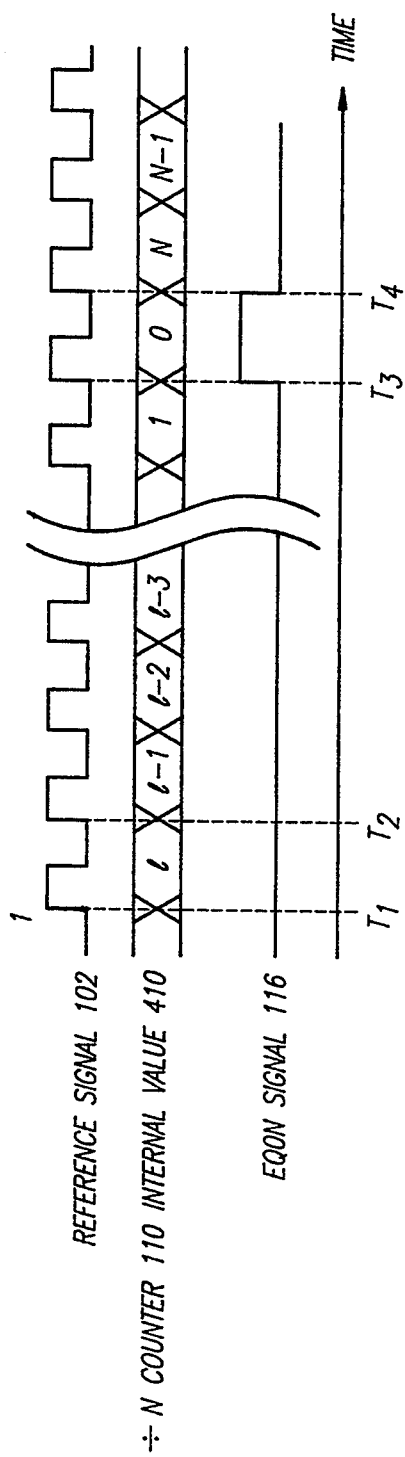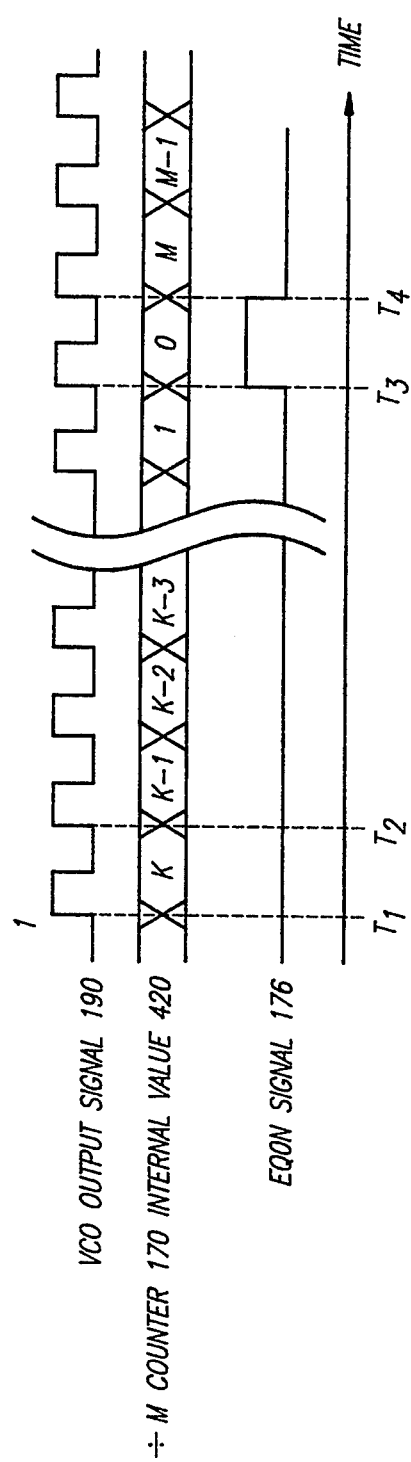
FIG. 4A PRIOR ART
FIG. 4B PRIOR ART

TIME BASED DATA SEPARATOR ZONE CHANGE SEQUENCE

BACKGROUND OF THE INVENTION

1. Field of the Invention

The present invention is related to the field of frequency synthesizers used in zone bit recording schemes for disk drives.

2. Background Art

Frequency synthesizers are used in time based generators implemented in disk drive systems that use zone bit recording schemes. In a zone bit recording scheme, data is written onto the media of a data disk at different frequencies according to the concentric zones of the data disk. In zones that are located near the outer circumference of the disk, the linear track length of the zone is longer than that of a zone located at an inner circumference. This is due to the greater zone circumference. In order to maintain a constant bit density in all zones, data is written at higher frequencies in zones near the outer circumference of the disk, whereas data is written at lower frequencies in zones near the inner circumference of the disk. In such applications, frequency synthesizers are used to implement the different write and read frequencies. When switching from one zone to another, the frequency synthesizer is reset to a frequency appropriate for the new zone.

A time base generator (TBG) is a phase-locked loop (PLL) based circuit that provides a programmable reference frequency for constant density recording applications. The time base generator requires a loop filter to control its PLL locking characteristic. In read, write and idle modes, the TBG provides a stable frequency. The synthesized frequency is programmed using two registers of the TBG. These registers are referred to as the M and N registers of the TBG.

The time based generator comprises a PLL circuit. In general, a PLL circuit acquires the nominal frequency of a reference signal and tracks deviations in its nominal frequency. The PLL produces an output clock frequency that varies according to deviations of the reference frequency. In order to track the reference signal frequency, the PLL circuit compares the phase of a signal dependent on the reference signal to the phase of a signal dependent on the PLL output signal. The difference in phase between the two frequencies produces an error signal that drives a voltage controlled oscillator (VCO) of the PLL, thereby forcing the VCO output frequency to follow changes in the reference frequency. In TBG circuits, the reference signal is a fixed frequency signal and the VCO center frequency is controlled by a control current (or voltage) as described below.

FIG. 1 is a block diagram of a prior art circuit for implementing a frequency synthesizer comprising divide-by-N and divide-by-M counters 110 and 170, phase detector 120, charge pump 130, loop filter 140, VCO amplifier 150, VCO 160 and digital-to-analog converter (DAC) 180. The circuit illustrated in FIG. 1 is a frequency synthesizer for providing a VCO output signal 190 that is dependent upon a reference signal 102 and divide-by-N and divide-by-M counters 110 and 170. Reference signal 102 and N input 104 are provided to divide-by-N counter 110. The output 114 of divide-by-N counter 110 provides EQΦN signal 116 and is coupled to a first input of phase detector 120. M input 106 is provided to divide-by-M counter 170. The output 172 of divide-by-M counter 170 provides EQΦM signal 176 and is coupled to a second input of phase detector 120. A first output 122 of phase detector 120 is coupled to a first input of charge pump 130 and provides a pump up (PU) signal 126. A second output 124 of phase detector 120 is coupled to a second input of charge pump 130 and provides a pump down (PD) signal 128.

Charge pump 130 provides an output 132 which is coupled to loop-filter 140 and to a first input of VCO amplifier 150. Loop filter 140 provides loop voltage 142 to VCO amplifier 150. The output 152 of VCO amplifier 150 provides adjust voltage 154 and is coupled to a first input of VCO 160. The output 162 of VCO 160 is coupled to a first input of divide-by-M counter 170 and provides VCO output signal 190. An M input 106 is provided to a second input of divide-by-M counter 170. Reference current 108 and data rate (DR) input 112 are provided to first and second inputs of DAC 180, respectively. The outputs 182, 184 and 186 are coupled to second inputs of charge pump 130, VCO amplifier 150 and VCO 160, respectively, and provide currents $I_{CP}$, $I_{BG}$ and $I_{BS}$ to charge pump 130, VCO amplifier 150 and VCO 160, respectively.

N input 104 is an N+1 bit value provided to divide-by-N counter 110. The output 114 of divide-by-N counter 110 is EQΦN signal 116 having a frequency, $f_{REF} \div N$, where $f_{REF}$ is the reference frequency of reference signal 102. M input 106 is an M+1 bit value provided to divide-by-M counter 170. The output 172 of divide-by-M counter 170 is EQΦM signal 176 having a frequency, $f_{VCO} \div M$, where $f_{VCO}$ is the frequency of VCO output signal 190. Phase detector 120 compares frequency $f_{REF} \div N$ of EQΦN signal 116 to the frequency $f_{VCO} \div M$ of EQΦM signal 176 provided to the second input of phase detector 110. Phase detector 110 generates one of two signals, pump up signal 126 or pump down signal 128, indicating the difference in phase between EQΦN signal 116 and EQΦM signal 176. If EQΦN signal 116 is higher in frequency than EQΦM signal 176, phase detector 120 outputs a pulse(s) on pump up signal 126 to increase the frequency $f_{VCO}$ of VCO output signal 190. Analogously, if EQΦN signal 116 is lower in frequency than EQΦM signal 176, phase detector 120 outputs a pulse(s) on pump down signal 128 to decrease the frequency $f_{VCO}$ of VCO output signal 190.

Pump up signal 126 and pump down signal 128 are provided to charge pump 130 which generates an output current 132 in response to the signals. Charge pump 130 is well-known in the art and therefore is not shown in greater detail. Output current 132 of charge pump 130 is provided to loop filter 140 which produces loop voltage 142 in response. Pump Lip signal 126 causes charge pump 130 to increase loop voltage 142 generated by loop filter 140 by sourcing output current 132, whereas pump down signal 128 reduces loop voltage 142 by sinking output current 132 provided to loop filter 140. Thus, pump up signal 126 and pump down signal 128 act to provide current pulses for output 132 of charge pump 130. This is affected by transferring charge through transistor action in response to the pump up and pump down signals 126–128, respectively.

As is well-known in the art, output 182 of DAC 180 provides charge pump current $I_{CP}$ to charge pump 130 thereby controlling the rate at which charge pump 130 changes the loop voltage provided by loop filter 140. In time base generator applications, the circuit of FIG. 1 provides a higher frequency VCO output frequency at outer concentric zones and therefore loop filter 140 must provide more rapid changes in loop voltage 142 that controls VCO 160 in order to track reference signal 102. Thus, charge pump current $I_{CP}$ controls the current levels of output current 132 provided to loop filter 140.

The analog voltage generated by loop filter 140 is provided to VCO amplifier 150. VCO amplifier 150 accordingly attenuates or amplifies loop voltage 142 in order to drive VCO 160. The output 152 of VCO amplifier 150 is coupled to a first input of VCO 160. The output 152 of VCO amplifier 150 causes VCO 160 to produce VCO output signal 190 having a corresponding frequency $f_{VCO}$. VCO output signal 190 is provided to a first input of divide-by-M counter 170. Divide-by-M counter 170 generates EQΦM signal 176 having a frequency equal to $f_{VCO} \div M$.

Reference current 108 is provided to DAC 180 and is used to set the current levels of currents $I_{CP}$, $I_{BG}$ and $I_{BS}$ provided by outputs 182, 184 and 186 of DAC 180, respectively. DR input 112 provided to DAC 180 is a P+1 bit digital value that further controls the current levels of currents $I_{CP}$, $I_{BG}$ and $I_{BS}$ provided by outputs 182, 184 and 186 of DAC 180, respectively. In general, currents $I_{CP}$ and $I_{BG}$ are determined by data rate input 112 while current $I_{BS}$ is constant. In particular applications, current $I_{BS}$ is also programmable according to DR input 112. Current $I_{BS}$ sets the center frequency of VCO 160.

Once the frequency $f_{VCO} \div M$ of EQΦM signal 176 becomes equal to, or captures, the frequency $f_{REF} \div N$ of EQΦN signal 116, the PLL produces a dependent frequency for VCO output signal 190 over a range of frequencies referred to as the lock range. The lock range is the range of phase values for the difference in phase between EQΦN and EQΦM signals 116 and 176 that produces an appropriate voltage level at the output 152 of VCO amplifier 150. In general, the lock range forces frequency $f_{VCO}$ of VCO output signal 190 to track frequency $f_{REF}$ of reference signal 102.

FIGS. 4–6 are timing diagrams illustrating signals for operating the prior art frequency synthesizer of FIG. 1. FIG. 4A is a timing diagram illustrating the operation of divide-by-N counter 110. Reference signal 102 clocks the operation of divide-by-N counter 110. The internal value 410 of divide-by-N counter 110 is illustrated in FIG. 4A with respect to reference signal 102. Transitions in the internal value 410 of divide-by-N counter 110 are indicated with an X in the drawing. At time T1, the rising edge reference signal 102 clocks divide-by-N counter 110 producing an internal value 410 of 1. At time T2, divide-by-N counter 110 is decremented to 1−1 for its internal value 410. Reference signal 102 continues to clock divide-by-N counter 110, thereby decrementing the internal value 410 of divide-by-N counter 110. At time T3, the internal value 410 of divide-by-N counter 110 is decremented from 1 to 0, thereby forcing EQΦN signal 116 to logic high. EQΦN signal 116 remains high for one clock cycle of reference signal 102 and has a transition to logic low at time T4. At time T4, the internal value 410 of divide-by-N counter 110 is set to N and commences counting again. A disadvantage of this prior art counter is that if a new N input 104 provided to divide-by-N counter 110 changes at time T4, the value of N becomes unpredictable. The divide-by-N counter 170 may load intermediate values at time T4 which drive the frequency synthesizer away from the desired output frequency of VCO) 160.

FIG. 4B is a timing diagram for divide-by-M counter 170. VCO output signal 190 clocks divide-by-M counter 170. Divide-by-M counter 170 operates analogously to the description above for FIG. 4A. Thus, if a new M input 106 provided to divide-by-M counter 170 changes at time T4, the value of M becomes unpredictable. The divide-by-M counter 170 may load intermediate values at time T4 which drive the frequency synthesizer away from the desired output frequency of VCO 160.

FIG. 5 is a timing diagram illustrating the operation of phase detector 120. EQΦN signal 116 generated by divide-by-N counter 110 is set logic high at time T1, thereby producing a rising edge transition in pump up signal 126. Phase detector 120 sets pump up signal 126 to logic high at time T1. At time T2, pump signal 126 is set low by phase detector 120 while EQΦM signal 176 becomes high. This produces a glitch in pump down signal 128 when phase detector 120 is reset at time T2. At time T3, EQΦM signal 128 is set high producing a logic level high in pump down signal 128 output by phase detector 120. At time T4, pump down signal 128 is set to logic level low while EQΦN signal 116 is set logic high. Because EQΦN signal 116 is high at time T4, a small glitch appears in the pump up signal 126 when phase detector 120 is reset. At time T5, both EQΦN and EQΦM signals 116 and 176 are set high by counters 110 and 170, respectively, thereby producing glitches in pump up and pump down signals 126 and 128.

The glitches illustrated in FIG. 5 at times T1–T5 are artifacts of phase detector 120. The glitches are intended to insure that phase detector does not have a dead band. A dead band occurs when the phases of EQΦN and EQΦM signals 116 and 176 are very close to one another, thereby producing zero phase difference at the output of the phase detector. This causes the PLL to drift away from lock on reference signal 102 because an appropriate loop voltage 142 is not produced in response to the approximately zero phase difference.

FIG. 6 is a timing diagram illustrating charge pump current 132 and loop voltage 142 produced by charge pump 130 and loop filter 140, respectively, in response to pump up signal 126 and pump down signal 128. At time T1, pump up signal 126 is set high by phase detector 120. This causes charge pump 130 to output a positive current 132 to loop filter 140, thereby increasing positive loop voltage 142. Loop voltage 142 increases as long as pump up signal 126 remains high. At time T2, pump up signal 126 is set low, thereby setting charge pump current 132 to zero. Accordingly, loop voltage 142 begins to decay in amplitude. The glitch in pump down signal 128 at time T1 is suppressed by low pass filter 140. Similarly, at time T3, pump down signal 128 is asserted causing charge pump 130 to sink charge pump current 132. Therefore, loop filter 140 decreases loop voltage 142. Loop voltage 142 decreases until time T4 when pump down signal 128 is negated. Loop filter 140 suppresses the glitch in pump up signal 126 at time T4. At time T5, a glitch occurs in pump up signal 126 and pump down signal 128 (as illustrated in FIG. 5 when EQΦN and EQΦM signals 116 and 176 are both set high). The glitches are suppressed by filter 140.

The prior art circuit shown in FIG. 1 for implementing a frequency synthesizer includes counters 110 and 170 for controlling the output frequency of the frequency synthesizer. During a zone change, counters 110 and 170 are loaded with a new values (related to frequency information). A settling time must elapse for a digital-to-analog converter (DAC) and PLL to acquire lock before the frequency synthesizer begins generating the new frequency for VCO output signal 190. The frequency of the VCO output signal 190 is given by the following expression:

$$f_{VCO} = f_{REF}(M+1)/(N+1), \quad (1)$$

where M and N are the values of M input 106 and N input 104 and $f_{REF}$ is the frequency of reference signal 102.

A disadvantage of this prior art scheme is that zone change-overs are performed without knowledge of loop voltage 142. If loop voltage 142 rails, predictions about the settling time are invalid and the system must wait a longer time to settle. This disadvantage of the prior art occurs when any one or all of the values stored in the registers/counters N, M and DR changes, causing the frequency synthesizer to behave unpredictably. The loop voltage, 142, adjustable voltage 154 and VCO output frequency $f_{VCO}$ are not predictable for a considerable amount of time. For this reason, the settling time and the ability of the frequency synthesizer to settle down to a new stable state cannot be predicted using classical PLL analysis. This unpredictable nature is due to the following factors: the loop voltage 142 and adjustable voltage 152 rail to a supply voltage level when transistors in each device saturate. The charge pump, VCO control circuit and VCO may not behave linearly (i.e., shutdown, saturate or rail). Linear response of each block is required to perform linear analysis for PLL operation.

Another disadvantage of the PLL circuit illustrated in FIG. 1 is that phase detector 120, loop filter 140 and VCO 160 are designed with a constraint of requiring a "graceful failure mechanism" when PLL circuit operation nears non-linear operation. The requirements for a graceful failure mechanism are: 1) the circuit must not latchup, 2) must not become unstable (i.e., undamped oscillation of the circuit) and 3) must be able to recover from the failed state without needing to remove power from the circuit.

A further disadvantage of the prior art circuit is an inability to predict the settling time if, in fact, the system can settle down. This inability to predict the settling time places an undue constraint and response time on systems using this type of frequency synthesizer.

Still another disadvantage of the prior art circuit is that the divide-by-N and divide-by-M counters may load extraneous, incorrect values that are neither the old or the new values to be loaded into the counters. This forces the phase-locked loop circuit to phase compare signals with the wrong phase for at least one phase comparison cycle. During the error time when the divide-by-N or divide-by-M counter 110 or 170 is counting using the wrong value, the phase-locked loop circuit is driven away from the intended final state of the PLL. Again, the prior art circuit requires longer settling times and may become unstable, and may never recover from the transient and settle.

SUMMARY OF THE PRESENT INVENTION

The present invention provides a method and an apparatus for controlling initial transients in a frequency synthesizer utilized in zone bit recording schemes for disk drives by controlling the start-up sequence of the device. The present invention provides a start-up sequence for the frequency synthesizer of a data separator comprising the following steps:

1. Reset the voltage controlled oscillator(s) (VCO), so that the VCO(s) are in a known state during start-up;
2. Shut down the charge pump;
3. Disable the phase detector of the phase-locked loop (PLL);
4. Load new data values into counter(s)/register(s) that control the synthesized frequency and provide the data values to a digital-to-analog converter (DAC); the data values program the center frequency of the VCO, the charge pump and the VCO amplifier;
5. Wait a fixed amount of time for the DAC to settle (i.e., 1.6 $\mu$s);
6. Enable divide-by-M and divide-by-N counters;
7. Enable the phase detector of the phase-locked loop (PLL); and
8. Start the VCO.

By utilizing a start-up sequence, the center frequency of the VCO is already settled when changing frequencies, the divide-by-M and divide-by-N counters are matched, the VCO starts in phase with the reference frequency, and the voltage of the loop filter is prevented from railing. The same start-up sequence for changing zones is also used when the frequency synthesizer comes out of sleep mode. The present invention uses dual buffered registers for the divide-by-M and divide-by-N counters and requires a certain amount of time to load the divide-by-M and divide-by-N registers. However, the present invention does not shut down the VCO during this time.

By using dual buffered registers, each counter retains its previous data value that is provided to the phase detector. Simultaneously, the register of each counter is loaded with a new data value. Once the new data values are loaded, the data values are then loaded into each counter simultaneously, thereby, changing the synthesized frequency of the VCO(s). The VCO(s) are shut down when the DAC are loaded to ready the zero phase restart of the VCO with the reference frequency. While the time base generator (TBG) is reset, a control signal is provided to the frequency synthesizer to keep it reset until the TBG turns on again.

The present invention comprises a timer that provides a 1.6 $\mu$s delay to allow the DAC to settle. Digital logic including flip-flops and a NOR gate is used to synchronize signals. A load-in signal is provided to the divide-by-N and divide-by-M counters to reset the counters and hold a new value. A reset signal is provided to the phase detector to shut down the phase detector. Delay compensation circuitry is used to implement delay cancellation for zero phase restart.

BRIEF DESCRIPTION OF THE DRAWINGS

FIGS. 4A-4B are prior art timing diagrams illustrating the operation of divide-by-N and divide-by-M counters 110 and 170.

DETAILED DESCRIPTION OF THE PRESENT INVENTION

A method and an apparatus for controlling transients in a frequency synthesizer utilized in zone bit recording schemes for disk drives by controlling the start-up sequence of the device is described. In the following description, numerous specific details, such as number and nature of external signals, counters, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

Figure 7:
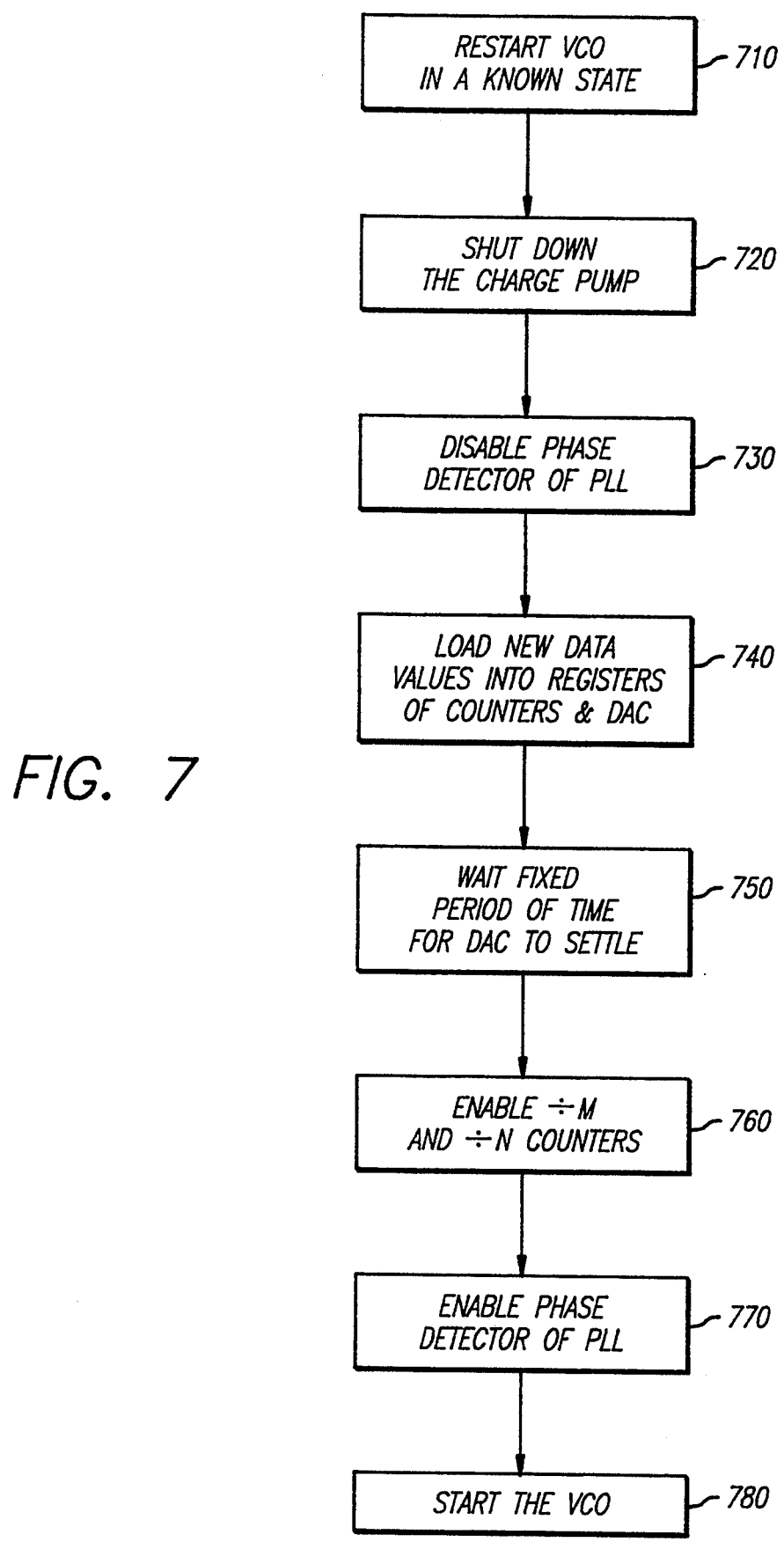
FIG. 7 is a flowchart illustrating the steps for controlling the start up sequence of a frequency synthesizer according to the present invention.

FIG. 7 is a flowchart illustrating the start-up sequence for a frequency synthesizer of a time based generator according to the present invention. In step 710, the voltage controlled oscillator(s) (VCO) is reset, so that the VCO(s) are in a known state during start-up. In step 720, the charge pump is shut down. In step 730, the phase detector of the phase-locked loop (PLL) is disabled. In step 740, new data values are loaded into counter(s)/register(s) that control the synthesized frequency and provide a data value to a digital-to-analog converter (DAC). The data values program the charge pump, the VCO amplifier and the center frequency of the VCO. In step 750, a fixed amount of time is allowed to elapse for the DAC to settle (i.e., 1.6 $\mu$s). In step 760, the divide-by-M and divide-by-N counters are enabled. In step 770, the phase detector of the phase-locked loop (PLL) is enabled. In step 780, the VCO is restarted.

By utilizing a start-up sequence as illustrated in FIG. 7, the center frequency of the VCO is already settled when switching zones, the divide-by-M and divide-by-N counters are matched, the VCO starts in phase with the reference frequency, and the voltage of the loop filter is prevented from railing. The same start-up sequence for changing zones is also used when the time based generator comes out of sleep mode. The present invention uses dual buffered registers for the M and N counters and requires a certain amount of time to load the M and N registers. However, the present invention does not shut down the VCO during this time. By using dual buffered registers for each counter, loading of the M and N counters is accomplished without shutting down the VCO.

In particular, each counter retains its previous data value that is provided to the VCO. Simultaneously, the dual buffered register of each counter is loaded with a new data value. Once the new data values are loaded., the data values are then loaded simultaneously into each counter, thereby, changing the frequency of the VCO(s). The VCO(s) are shut down when the DACs are loaded to prevent the VCO(s) from operating non-linearly. While the time base generator (TBG) is reset, a control signal is provided to the frequency generator to keep it reset until the TBG turns on again.

The present invention comprises a timer that provides a 1.6 $\mu$s delay to allow the DAC to settle. Digital logic including flip-flops and a NOR gate is used to synchronize signals. A load-in signal is provided to the divide-by-N and divide-by-M counters to reset the counters and hold a new value. A reset signal is provided to the phase detector to shut down the phase detector. Delay compensation circuitry is used to implement delay cancellation for zero phase restart.

Figure 1:
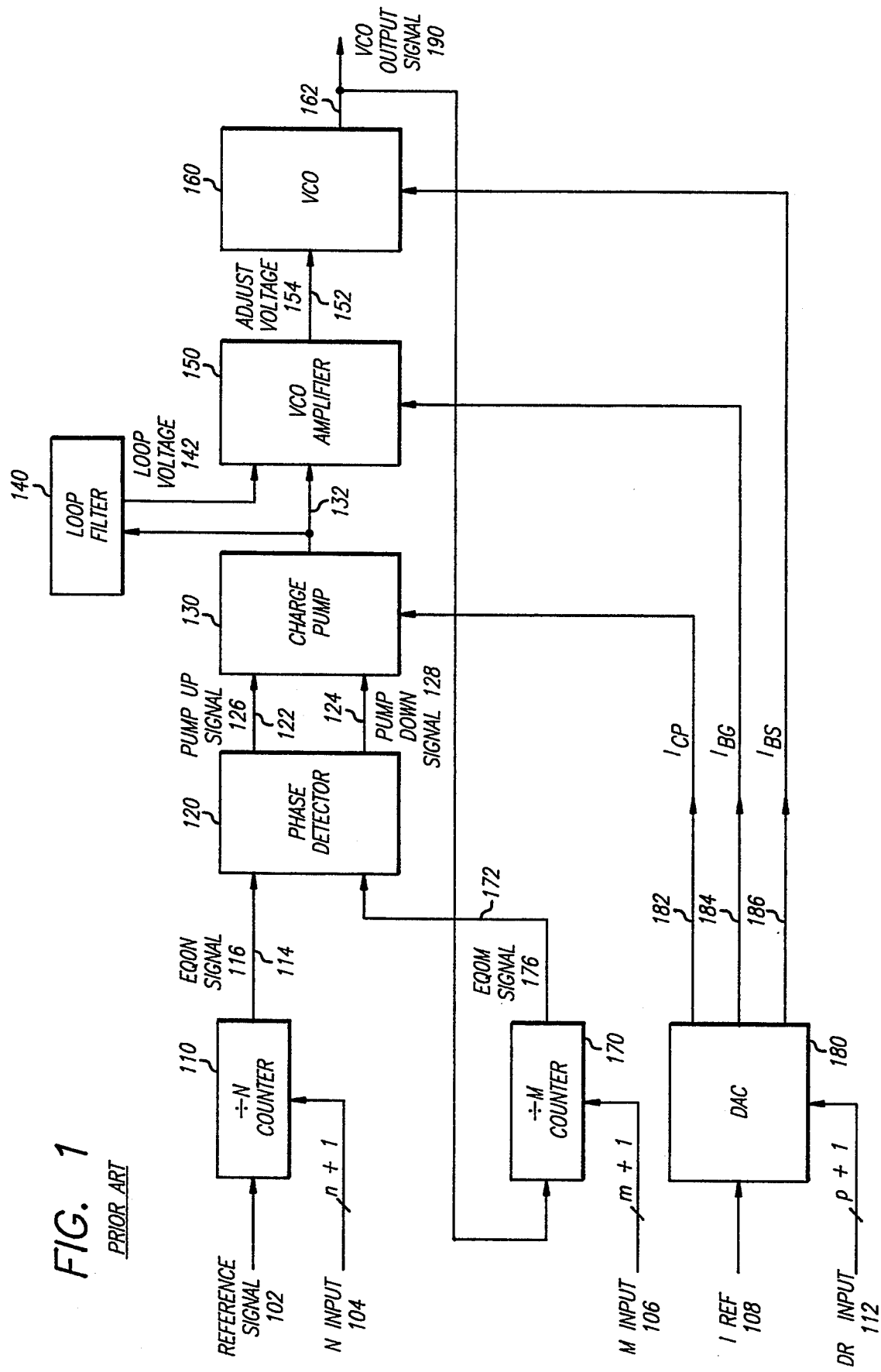
FIG. 1 is a diagram illustrating a prior art frequency synthesizer.
Figure 2:
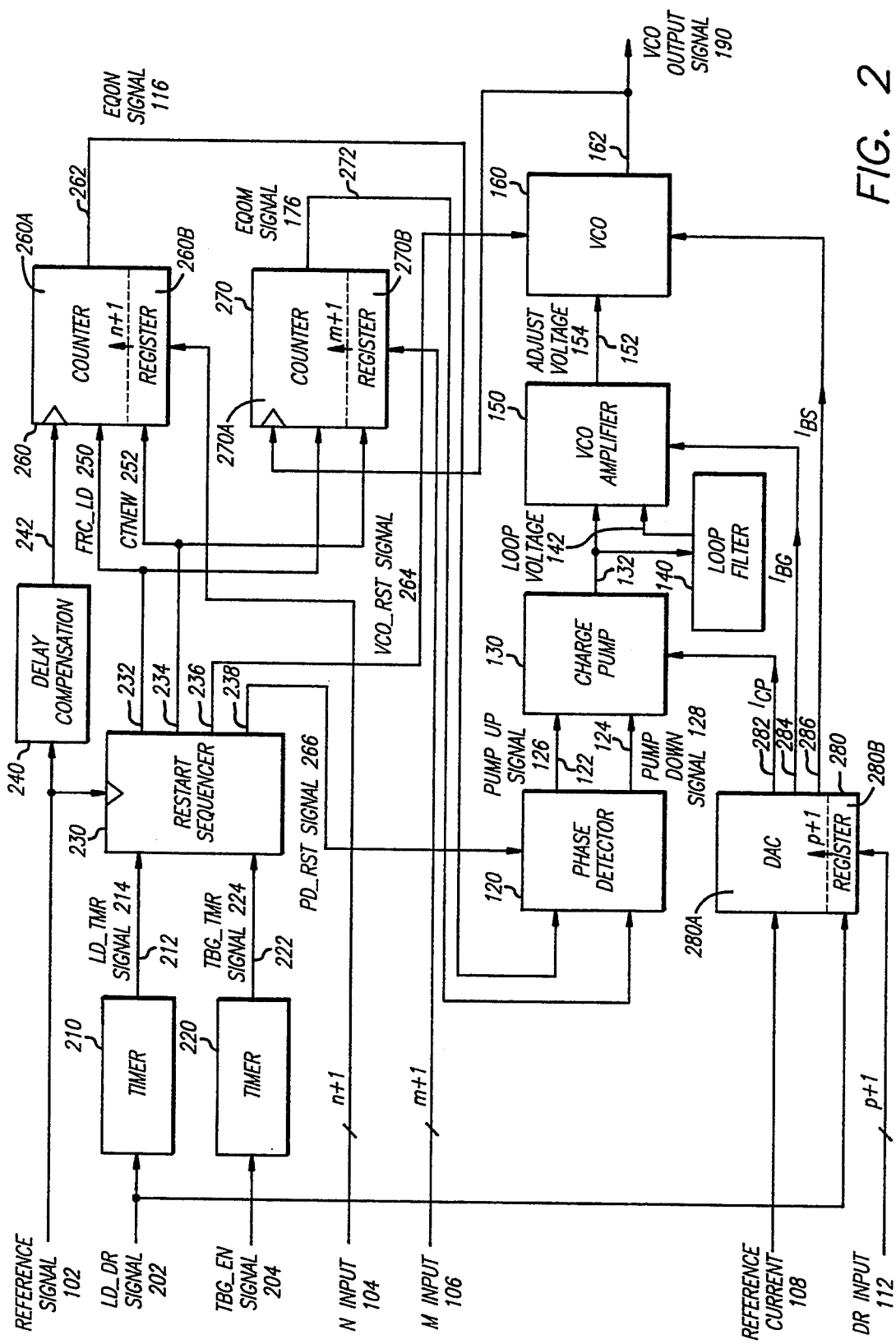
FIG. 2 is a diagram illustrating the present invention.

FIG. 2 is a diagram illustrating the present invention comprising a frequency synthesizer (as shown in FIG. 1), timers 210 and 220, restart sequencer 230, delay compensation 240, counters 260 and 270 and digital-to-analog converter (DAC) 280. The circuit of FIG. 2 controls transients in the frequency synthesizer utilized in zone bit recording schemes for disk drives by controlling the start-up sequence of the device. Reference signal 102 is provided to delay compensation block 240 and a clock input of restart sequencer 230. The output 242 of delay compensation 240 is coupled to a clock input of counter 260.

Load data register (LD_DR) signal 202 is provided to the input of timer 210 and a first input of register 280B of DAC 280. Time based generator enable (TBG_EN) signal 204 is provided to the input of timer 220. The outputs 212 and 222 of timers 210 and 220 are coupled to first and second inputs of restart sequencer 230. Output 232 of restart sequencer 230 provides force load (FRC_LD) signal 250 and is coupled to first inputs of counter 260 and 270. Divide-by-N counter 260 comprises counter 260A and register 260B. Similarly, divide-by-M counter 270 comprises counter 270A and register 270B. Output 234 of restart sequencer 230 provides count new (CTNEW) signal 252 and is coupled to first inputs of registers 260B and 270B of counters 260 and 270. N input 104 and M input 106 are coupled to second inputs of registers 260B and 270B of counters 260 and 270, respectively. Output 236 of restart sequencer 236 is coupled to a first input of voltage controlled oscillator (VCO) 160. Output 238 of restart sequencer 230 is coupled to a first input of phase detector 120.

Outputs 262 and 272 of counters 260 and 270 provide EQ$\Phi$N signal 116 and EQ$\Phi$M signal 176 and are coupled to second and third inputs of phase detector 120, respectively. Outputs 122 and 124 provide pump up signal 126 and pump down signal 128 and are coupled to first and second inputs of charge pump 130, respectively. Output 132 of charge pump 130 is coupled to loop filter 140 and to a first input of VCO amplifier 150. Loop filter 140 provides loop voltage ($V_{LOOP}$) signal 142 which drives VCO amplifier 150. Output 152 of VCO amplifier 150 provides adjust voltage ($V_{ADJ}$) signal 154 and is coupled to a second input of VCO 160. Output 162 of VCO 160 provides VCO output signal 190 and is coupled to a clock input of counter 270.

Reference current ($I_{REF}$) 108 is provided to DAC 280. DAC 280 comprises DAC circuitry 280A and register 280B. Data rate (DR) input 112 is coupled to a second input of register 280B of DAC 280. Output 282 of DAC 280 provides charge pump current ($I_{CG}$) and is coupled to a third input of charge pump 130. Output 284 of DAC 280 provides bandgap current ($I_{BG}$) and is coupled to a second input of VCO amplifier 150.

Reference signal 102 provides reference frequency $f_{REF}$ that is used to clock restart sequencer 230. Reference signal 102 is delay compensated by delay compensation block 240 and provided to the clock input of divide-by-N counter 260. Delay compensation block 240 provides delay compensation to reference signal 102 to compensate for phase delay between the nominal reference frequency $f_{REF}$ and VCO frequency $f_{VCO}$ due to the restart circuitry of the PLL. Thus, when the PLL is restarted the reference signal 102 and VCO output signal 190 are provided to the clock inputs of divide-by-M counter 270 and divide-by-N counter 260, respectively. There is nearly zero phase difference between the two signals.

Delay compensation block 240 illustrated in FIG. 2 delays reference signal 102 by an amount equal to the delay due to the restart circuitry of the PLL. After proper restart sequencing and locking of the PLL on reference signal 102, VCO 160 produces a VCO output signal 190 to drive divide-by-M counter 270. Delay compensation 240 sets the phase difference between the reference signal 102 and VCO output signal 190 to zero after restart. Thus, reducing residual phase error between reference signal 102 and VCO output signal 190 after restart minimizes initial phase error to reduce transients in adjust voltage 154 for controlling VCO 160 and frequency excursions generated by VCO 160.

LD_DR signal 202 is provided to timer 210. Timer 210 requires a fixed amount of time before providing LD_DR signal 202 to restart sequencer 230. Similarly, TBG_EN signal 204 is provided to timer 220. Timer 220 requires a fixed amount of time before providing TBG_EN signal 204 to restart sequencer 230. LD_DR signal 202 and TBG_EN signal 204 in conjunction with reference signal 102 control loading of new count values into registers 260B and 270B of counters 260 and 270, resetting counters 260 and 270 with new values stored in registers 260B and 270B, and enable and disable both phase detector 120 and VCO 160. Output 238 of restart sequencer 230 enables or disables phase detector 120. Output 236 of restart sequencer 230 enables or disables VCO 160. Restart sequencer 230 for controlling the start-up sequence of the frequency synthesizer may be comprised of several flip-flops and a NOR gate or similar logic circuitry and therefore is not shown in greater detail.

DAC 280 comprises DAC circuitry 280A and register 280B. Register 280B is used to load new DAC values for switching zones and is driven by LD_DR signal 202. Reference current 108 is provided to DAC circuitry 280A and is used with a value loaded from register 280B to generate currents $I_{CP}$, $I_{BG}$ and $I_{BS}$. DR input 112 is a P+1 bit value.

N input 104 is an N+1 bit value provided to register 260B of divide-by-N counter 260. The output 262 of divide-by-N counter 260 is a EQΦN signal 116 having a frequency, $f_{REF} \div N$, where $f_{REF}$ is the reference frequency of reference signal 102. M input 106 is an M+1 bit value provided to register 270B of divide-by-M counter 270. The output 272 of divide-by-M counter 270 is a EQΦM signal 176 having a frequency, $f_{VCO} \div M$, where $f_{VCO}$ is the frequency of VCO output signal 190. Phase detector 120 compares frequency $f_{REF} \div N$ of EQΦN signal 116 to the frequency $f_{VCO} \div M$ of EQΦM signal 176 provided to the second input of phase detector 120. Phase detector 120 generates one of two signals, pump up signal 126 or pump down signal 128, indicating the difference in phase between EQΦN signal 116 and EQΦM signal 176. If EQΦN signal 116 is higher in frequency than EQΦM signal 176, phase detector 120 outputs a pulse(s) on pump up signal 126 to increase the frequency $f_{VCO}$ of VCO output signal 190. If EQΦN signal 116 is lower in frequency than EQΦM signal 176, phase detector 120 outputs a pulse(s) on pump down signal 128 to decrease the frequency $f_{VCO}$ of VCO output signal 190.

Pump up signal 126 and pump down signal 128 are provided to charge pump 130 which generates an output current 132 in response to the signals. Charge pump 130 is well-known in the art and therefore is not shown in greater detail. Output current 132 of charge pump 130 is provided to loop filter 140 which produces a loop voltage 142 in response. Pump up signal 126 causes charge pump 130 to increase loop voltage 142 generated by loop filter 140 by sourcing output current 132, whereas pump down signal 128 reduces loop voltage 142 by sinking output current 132 provided to loop filter 140. Thus, pump up signal 126 and pump down signal 128 act to provide current pulses for output signal 132 of charge pump 130. This is affected by transferring charge through transistor action in response to the pump up and pump down signals 126-128, respectively.

As is well-known in the art, output 282 of DAC 280 provides charge pump current $I_{CP}$ to charge pump 130 thereby controlling the rate at which charge pump 130 changes loop voltage 142 provided by loop filter 140. In time base generator applications, the circuit of FIG. 2 provides a higher VCO output frequency at outer concentric zones. Therefore, loop filter 140 must provide more rapid changes in loop voltage 142 that controls VCO 160 in order to track reference signal 102. Thus, charge pump current $I_{CP}$ controls the current levels of output current 132 provided to loop filter 140.

Loop voltage 142 generated by loop filter 140 is provided to VCO amplifier 150. VCO amplifier 150 accordingly attenuates or amplifies the loop filter voltage in order to drive VCO 160. The output 152 of VCO amplifier 150 is coupled to an input of VCO 160. The output 152 of VCO amplifier 150 causes VCO 160 to produce VCO output signal 190 having a corresponding frequency $f_{VCO}$. VCO output signal 190 is provided to a clock input of divide-by-M counter 270. Divide-by-M counter 270 generates EQΦM signal 116 having a frequency equal to $f_{VCO} \div M$. Once the frequency $f_{VCO} \div M$ of EQΦM signal 176 becomes equal to, or captures, the frequency $f_{REF} \div N$ of EQΦN signal 116, the PLL tracks changes in frequency of reference signal 102 producing a dependent frequency for VCO output signal 190 over a range of frequencies referred to as the lock range (as described above with reference to FIG. 1).

Figure 3:
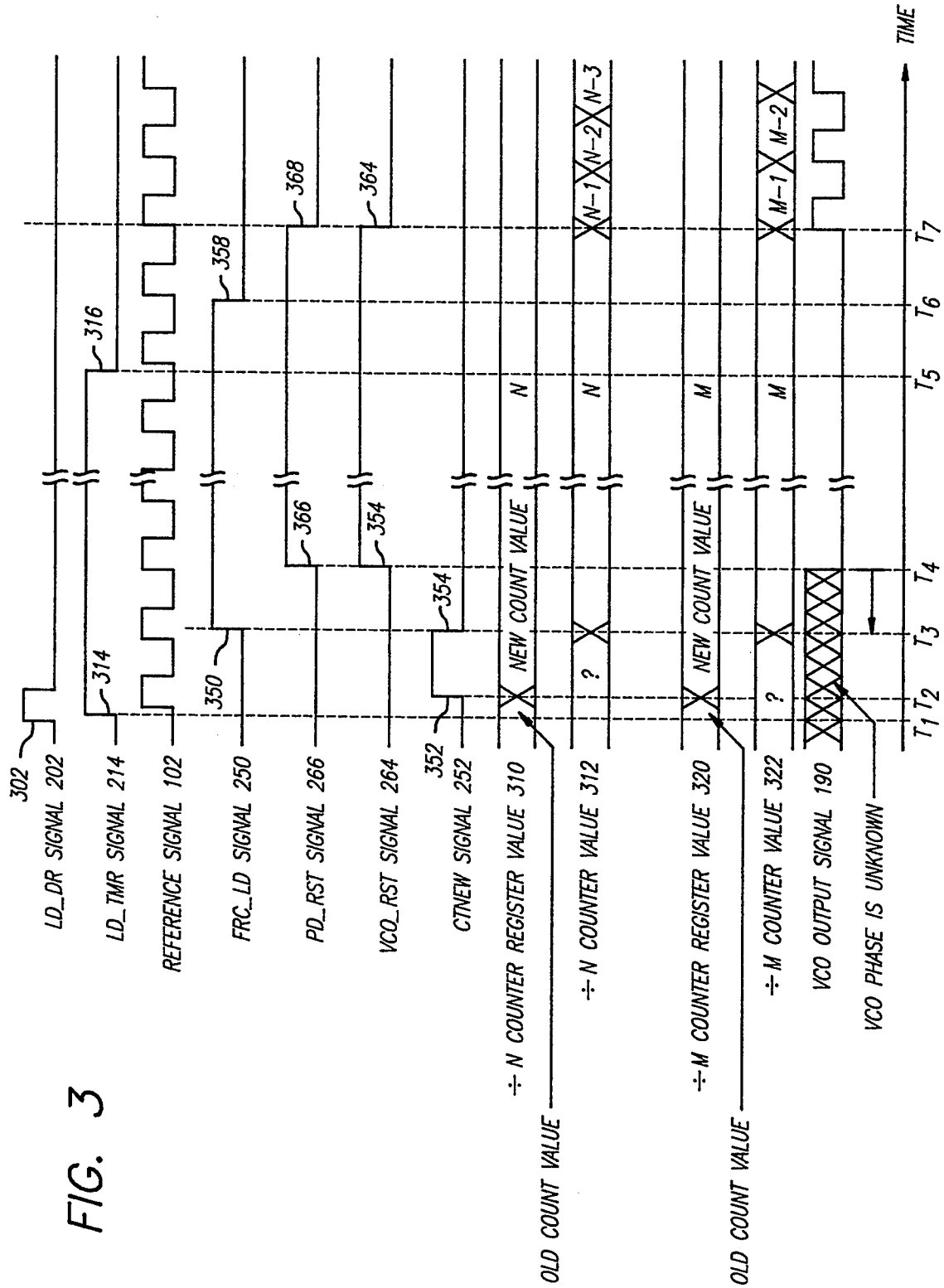
FIG. 3 is a timing diagram illustrating signals for controlling the start-up sequence of a frequency synthesizer according to the present invention.
Figure 5:
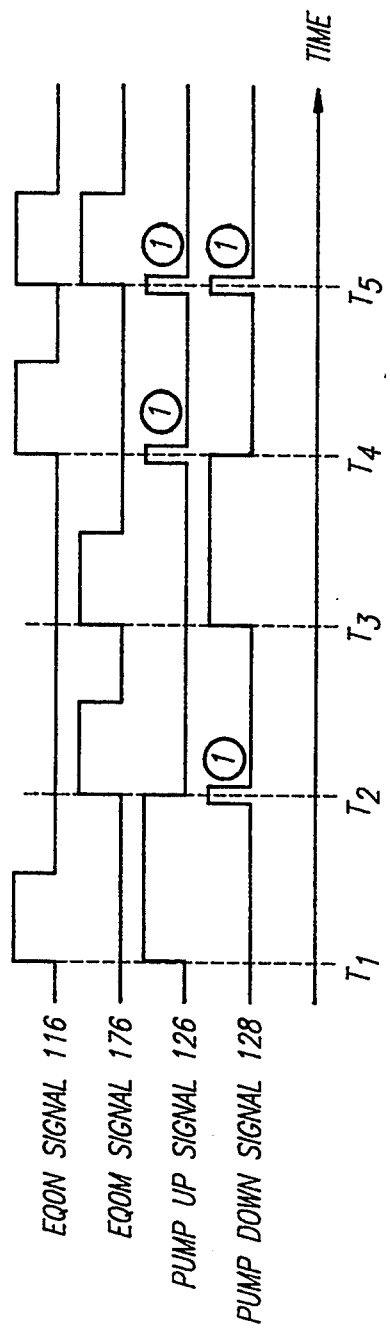
FIG. 5 is a prior art timing diagram illustrating operation of phase detector 120.
Figure 6:
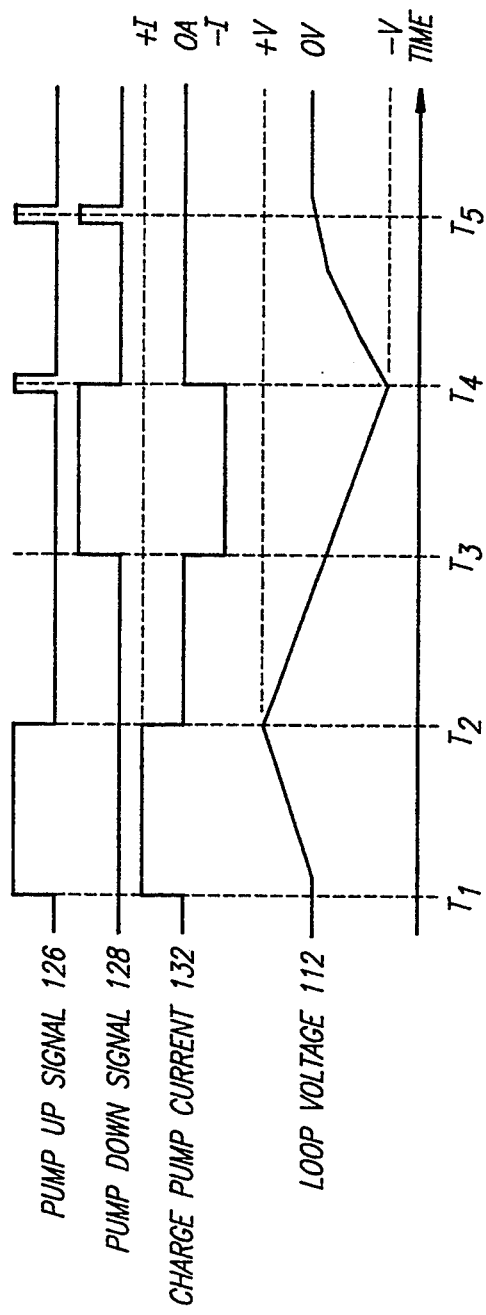
FIG. 6 is a prior art timing diagram illustrating operation of charge pump 130.

Operation of the start-up sequence for controlling transients in the frequency synthesizer is described with reference to the timing diagram illustrated in FIG. 3. FIG. 3 shoves the timing relationships between signals for operating restart sequencer 230, DAC 280, phase detector 120, charge pump 130, VCO amplifier 150 and divide-by-N and divide-by-M counters 260 and 270. TBG_EN signal 204 is not illustrated in FIG. 3, however, it is assumed in the following description that TBG_EN signal 204 is asserted. LD_DR signal 202 is applied to timer 210 and to DAC 280. On the rising edge 302 of LD_DR signal 202 at time T1, DAC circuitry 280A loads the data rate value stored in register 280B. Loading the new data rate value into DAC 280 produces transients in DAC 280 that require 1.6 μs to settle before the output currents $I_{CP}$ and $I_{BG}$ become stable. DR input 112 is a value indicating the data rate for a zone of the disk system. Therefore, for a given zone, charge pump current $I_{CP}$ and VCO amplifier $I_{BG}$ adjust the phase detector gain (charge pump 130) and the amplifier gain of VCO amplifier 150, respectively.

Timers 210 and 220 delay LD_DR signal 202 and TBG_EN signal 204 to compensate for the 1.6 μs time required for DAC 280 to settle. Thus, once DAC 280 is settled, timer 210 asserts LD_TMR signal 214 which goes high at rising edge 314 and is provided to restart sequencer 230. Reference signal 102 clocks restart sequencer 230. At time T2, restart sequencer asserts CTNEW signal 252 which goes high at rising edge 352. At transition 352 of CTNEW signal 252, new values for N input 104 and M input 106 are latched into registers 260B and 270B of counters 260 and 270, respectively. The latching of divide-by-N counter register value 310 and divide-by-M counter register value 320 is indicated by an X in for each signal. Old count values for divide-by-N counter register value 310 and divide-by-M counter register value 320 are indicated prior to each X and new values are indicated after each X at time T2.

On the falling edge 354 at time T3, CTNEW signal 252 is negated. FRC_LD signal 250 is asserted at transition 350 which occurs at time T3. The divide-by-N and divide-by-M counter register values 310 and 320 are loaded into counter circuitry 260A and 270A, respectively, by asserting FRC_LD signal 250. The divide-by-N and divide-by-M counter values 312 and 322 of counters 260 and 270 are unknown prior to falling edge 354 of CTNEW signal 252 as indicated by a question mark in FIG. 3 for each signal. At time T3, the latching of the divide-by-N and divide-by-M counter register values 310 and 320 into counters 260 and 270, respectively, is indicated by an X for each signal. After time T3, the divide-by-N and divide-by-M counter values 312 and 322 are held at the new value for each as divide-by-N and divide-by-M counters 260 and 270 are reset by FRC_LD signal 250.

Approximately one clock cycle of reference signal 102 after time T3, restart sequencer asserts phase detector reset (PD_RST) signal 266 and VCO reset (VCO_RST) signal 264. PD_RST signal 266 and VCO_RST signal 264. have rising edge transitions 366 and 354, respectively, that occur at approximately time T4. Asserting PD_RST signal 266 and VCO RST signal 264 at time T4 resets phase detector 120 and VCO 160, respectively. Prior to time T4, the VCO output signal 190 is assumed to be in an unknown state where the phase of the VCO is not known. This is indicated by a hatched pattern in FIG. 3 for VCO output signal 190 prior to time T4. The phase detector is forced to produce zero phase difference at its outputs 122 and 124 by PD_RST signal 266 being set high. The output 162 of VCO 160 is forced to a known state when VCO_RST signal 264 is asserted. VCO output signal 190 shown in FIG. 3 is logic low while VCO_RST signal 264 is asserted.

At time T5, LD_TMR signal 214 is negated having a falling edge transition 316. One clock cycle of reference signal 102, FRC_LD signal 250 is negated having a falling edge transition 358 at time T6. Prior to falling edge 358 of FRC_LD signal 250, the divide-by-N and divide-by-M counter values 312 and 322 of counters 260 and 270 are held at values of N and M, respectively. At time T7, restart sequencer 230 negates outputs 236 and 238, thereby producing falling edge transitions 364 and 368 of VCO_RST and PD_RST signals 264 and 266, respectively. At time T7, divide-by-N and divide-by-M counter values 312 and 322 of counters 260 and 270 are decremented once, thereby producing values of N−1 and M−1 for counters 260 and 270, respectively. The divide-by-N and divide-by-M counters 260 and 270, are then each decremented at a rate according to reference signal 102 and VCO) output signal 190 applied to the clock inputs of divide-by-N and divide-by-M counters 260 and 270, respectively.

After falling edge 358 of FRC_LD signal 250, each counter 260 and, 270 is enabled. At approximately time T7, PD_RST signal 266 and VCO_RST signal 264 are negated and therefore phase detector 120 and VCO 160 are enabled. Also at time T7, divide-by-N and divide-by-M counter values 312 and 322 are decremented and VCO 160 produces a stable VCO output signal 190 having a known phase.

Controlling the start-up sequence of a frequency synthesizer as shown in FIG. 2 is as follows. Stable values for N and M inputs 104 and 106 are provided to the inputs of registers 260B and 270B of counters 260 and 270. This is important since valid N and M count values must be loaded into registers 260B and 270B of counters 260 and 270. A stable value for DR input 112 is provided to register 280B of DAC 280. LD_DR signal 202 is pulsed high to load a new DR input 112 into register 280B of DAC 280 and starts timer 210. The N and M inputs 104 and 106, DR input 112 and LD_DR signal 202 are each controlled by external sources. Timer 210 delays operation of restart sequencer 230 for 1.6 μs until DAC 280 has settled.

While DAC 280 is settling, divide-by-N and divide-by-M counters 260 and 270 are loaded with new N and M values. Phase detector 120 and VCO 160 are reset. By resetting phase detector 120, pump up and pump down signals 126 and 128 are forced to an inactive state. This also puts charge pump 130 and loop filter 140 into inactive states. Restart sequencer 230 resets VCO 160 and arms it for toggling. When timer 210 times out, DAC 280 has settled. Similarly, charge pump 130, VCO amplifier 150 and VCO 160 are assumed to have settled from the transients experienced on currents $I_{CP}$, $I_{BG}$ and $I_{BS}$ generated by DAC 280. Currents $I_{CP}$, $I_{BG}$ and $I_{BS}$ are determined by data rate input 112. Current $I_{BS}$ programs the center frequency of VCO 160 according to DR input 112. Counters 260 and 270 latch new values from registers 260B and 270B, respectively.

Restart sequencer 230 starts when timer 210 times out. Restart sequencer 230 enables divide-by-N and divide-by-M counters 260 and 270 for counting. Phase detector 120 and VCO 160 are enabled when PD_RST signal 266 and VCO_RST signal 264 are removed. When VCO_RST signal 264 goes inactive, VCO 160 is triggered and begins oscillating. Delay compensation 240 delays reference signal 102 to phase match the pulse edges of reference signal 102 and VCO output signal 190. The divide-by-N and divide-by-M counters 260 and 270 begin decrementing and proper operation of the frequency synthesizer commences.

The present invention has several advantages over the prior art. An advantage of the present invention is that controlling the start-up sequence eases the design requirements for the charge pump, VCO amplifier and the VCO since the requirements for graceful failure and degradation are reduced by sequencing.

Another advantage of the present invention is the response of the system for new values of N, M and DR inputs that is predictable, thereby providing a better ability for the frequency synthesizer to settle and a faster settling time.

A further advantage of the present invention is that zero phase restart of the VCO is guaranteed through the use of the restart sequencer and delay compensation applied to the reference signal. This reduces the lock time of the PLL and transients on the loop and adjust voltages generated by the loop filter and VCO amplifier, respectively.

Another advantage of the present invention is that undesirable and unpredictable charge pump action on the loop voltage generated by the loop filter is eliminated. This reduces the likelihood of non-linear operation of both the VCO amplifier and the VCO.

Thus, a method and an apparatus for controlling transients in a frequency synthesizer utilized in zone bit recording schemes for disk drives by controlling the start-up sequence of the device has been described.

We claim:

1. A method for reducing transients in a frequency synthesizer circuit by controlling the startup sequence comprising the steps of:
    loading an initial data value into a digital-to-analog converting means, said digital-to-analog converting means being coupled to a phase comparison means, an amplification means and a voltage controlled oscillator means;
    loading new data values into a first and second register means of a corresponding first and second counting means, respectively, said first and second counting means being coupled to said phase comparison means;
    resetting said voltage controlled oscillator means to a predetermined state wherein said oscillating means is coupled to said second counting means;
    disabling said phase comparing means;
    pausing for a predetermined period of time for said digital-to-analog converting means to stabilize;
    reactuating said first and second counting means; and
    restarting said phase comparing means and said voltage controlled oscillator means.

2. A method for starting up a frequency synthesizer circuit, said circuit comprising a phase comparison means coupled to a voltage controlled oscillator (VCO) and to a digital-to-analog converter (D/A), the method comprising the steps of:
    loading said D/A with a predetermined data value, then pausing for a predetermined period of time for said D/A to stabilize;
    disabling said phase comparison means and said VCO for said predetermined period of time; and
    enabling said phase comparison means and said VCO when said predetermined period of time has elapsed, whereby said VCO begins to synthesize a frequency corresponding to said predetermined data value.

3. The method of claim 2 wherein said predetermined data value represents a particular zone of a data disk.

4. The method of claim 3 wherein said synthesized frequency increases in response to an increase in said predetermined data value.

5. The method of claim 3 wherein said phase comparison means is comprised of a phase detector, a charge pump, a loop filter, and an amplifier.

6. The method of claim 2 wherein said predetermined period of time is approximately 1.6 microseconds.

7. A start-up circuit for a frequency synthesizer, said frequency synthesizer comprising a phase comparison means coupled to a voltage controlled oscillator (VCO), and a digital-to-analog converter (D/A) coupled to said phase comparison means and said VCO, the start-up circuit comprising:
    means for timing a period of time elapsed after loading said D/A with a predetermined data value; and
    means coupled to and driven by said timing means for enabling said phase comparison means and said VCO when said period of time has elapsed.

8. The start-up circuit of claim 7 wherein the timing means is comprised of a timer.

9. The start-up circuit of claim 7 wherein said start-up circuit includes means for disabling said phase comparison means and said VCO when said D/A is loaded with said predetermined data value.

10. The start-up circuit of claim 7 wherein said enabling means is comprised of a restart sequencer coupled to an input reference signal and said timing means, said restart sequencer enabling said phase comparison means and said VCO when said period of time has elapsed.

11. The start-up circuit of claim 10 further comprising means for setting said ratio of a frequency of said input reference signal to a frequency of an output of said frequency synthesizer, said ratio setting means being coupled to and driven by said restart sequencer.

12. The start-up circuit of claim 11 wherein said ratio setting means is comprised of a divide by N counter and a divide by M counter, wherein said ratio of N to M controls said ratio of said frequency of said input reference signal to said frequency of said output of said frequency synthesizer.

13. The start-up circuit of claim 11 wherein said restart sequencer enables said ratio setting means substantially concurrently with said loading of said D/A with said predetermined data value.

14. The start-up circuit of claim 11 further comprising a delay compensation circuit for setting to zero said phase difference between said output of said frequency synthesizer and said input reference signal.

15. The start-up circuit of claim 7 wherein said phase comparison means is comprised of a phase detector, a charge pump, a loop filter, and an amplifier.

16. A start-up circuit for a frequency synthesizer, said frequency synthesizer comprising a phase comparison means coupled to a voltage controlled oscillator (VCO), and a digital-to-analog converter (D/A) coupled to said phase comparison means and said VCO, the start-up circuit comprising:
    a timer for timing a period of time elapsed after loading said D/A with a predetermined data value; and
    an enabler coupled to and driven by said timer for enabling said phase comparison means and said VCO when said period of time has elapsed.

17. The start-up circuit of claim 16 wherein said start-up circuit includes a disabler for disabling said phase comparison means and said VCO when said D/A is loaded with said predetermined data value.

18. The start-up circuit of claim 16 wherein said enabler is comprised of a restart sequencer coupled to an input reference signal and said timer, said restart sequencer enabling said phase comparison means and said VCO when said period of time has elapsed.

19. A frequency synthesizer for generating a frequency corresponding to a particular zone of a data disk, said frequency synthesizer comprising:
    a voltage controlled oscillator (VCO);
    a phase comparison means coupled to and driving said VCO;
    a digital-to-analog converting means (D/A) coupled to and controlling said VCO and said phase comparison means; and
    a start-up circuit driven by an input reference signal, said start-up circuit being coupled to said VCO and said phase comparison means, wherein said start-up circuit disables said VCO and said phase comparison means when said D/A is loaded with a predetermined data value, and wherein said start-up circuit enables said VCO and said phase comparison means when a period of time has elapsed after said D/A is loaded with said predetermined data value, said start-up circuit thereby reducing transients in said frequency synthesizer.

20. The frequency synthesizer of claim 19 wherein said start-up circuit is comprised of:

means for timing said period of time elapsed after said D/A is loaded with said predetermined data value; and means coupled to and driven by said timing means for enabling said phase comparison means and said VCO when said period of time has elapsed.

21. The frequency synthesizer of claim 19 wherein said start-up circuit is comprised of:

a timer for timing said period of time elapsed after said D/A is loaded with said predetermined data value; and an enabler coupled to and driven by said timer for enabling said phase comparison means and said VCO when said period of time has elapsed.

* * * * *